United States Patent
Yang et al.

(10) Patent No.: US 9,715,860 B2
(45) Date of Patent: Jul. 25, 2017

(54) SHIFT REGISTER UNIT AND DRIVING METHOD THEREOF, GATE DRIVING CIRCUIT AND DISPLAY APPARATUS

(71) Applicants: BOE TECHNOLOGY GROUP CO., LTD, Beijing (CN); BEIJING BOE OPTOELECTRONICS TECHNOLOGY CO., LTD., Beijing (CN)

(72) Inventors: Dong Yang, Beijing (CN); Xi Chen, Beijing (CN); Ming Yang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 181 days.

(21) Appl. No.: 14/388,651

(22) PCT Filed: Nov. 6, 2013

(86) PCT No.: PCT/CN2013/086639
§ 371 (c)(1),
(2) Date: Sep. 26, 2014

(87) PCT Pub. No.: WO2015/007031
PCT Pub. Date: Jan. 22, 2015

(65) Prior Publication Data
US 2016/0253975 A1 Sep. 1, 2016

(30) Foreign Application Priority Data
Jul. 16, 2013 (CN) .......................... 2013 1 0298058

(51) Int. Cl.
*G09G 3/36* (2006.01)
*G11C 19/28* (2006.01)

(52) U.S. Cl.
CPC .......... *G09G 3/3677* (2013.01); *G11C 19/28* (2013.01); *G09G 2300/0408* (2013.01);
(Continued)

(58) Field of Classification Search
CPC .................. G11C 19/28; G11C 19/287; G09G 2310/0286; G09G 2310/0267;
(Continued)

(56) References Cited

U.S. PATENT DOCUMENTS

2010/0150302 A1* 6/2010 Tsai ....................... G11C 19/28
377/79
2010/0164915 A1 7/2010 Kim et al.
(Continued)

FOREIGN PATENT DOCUMENTS

CN 101587752 A 11/2009
CN 102651186 A 8/2012
(Continued)

OTHER PUBLICATIONS

First Chinese Office Action dated Feb. 10, 2015; Appln. No. 201310298058.4.
Chinese Patent Certificate dated Dec. 9, 2015; CN103426114.
International Preliminary Report on Patentability issued Jan. 19, 2016; PCT/CN2013/086639.
International Search Report Appln. No. PCT/CN2013/086639; Dated Apr. 10, 2014.

*Primary Examiner* — Nalini Mummalaneni
*Assistant Examiner* — Maheen Javed
(74) *Attorney, Agent, or Firm* — Ladas & Parry LLP

(57) ABSTRACT

A shift register unit and driving method thereof, a gate driving circuit and a display apparatus are provided. The potential of the pull-up control node is continuously raised by the output signals of multiple stages of shift register circuits. The high level of the pull-up control node can be used to release output noise of the shift register unit, such as to improve the quality of the display apparatus product, and ensures the life and the long time stable operation of the GOA circuit. The shift register unit provided by embodi- (Continued)

ments of the present disclosure comprises an input module, a pull-up module, a pull-down control module, a pull-up control module and a pull-down module.

20 Claims, 6 Drawing Sheets

(52) U.S. Cl.
CPC ........... *G09G 2300/0426* (2013.01); *G09G 2310/0224* (2013.01); *G09G 2310/0286* (2013.01); *G09G 2310/0289* (2013.01); *G09G 2320/0214* (2013.01); *G09G 2320/043* (2013.01)

(58) Field of Classification Search
CPC ......... G09G 2310/0283; G09G 3/3674; G09G 3/3677; H03K 19/00361
See application file for complete search history.

(56) References Cited

U.S. PATENT DOCUMENTS

| | | |
|---|---|---|
| 2012/0256817 A1 | 10/2012 | Chen et al. |
| 2013/0169609 A1* | 7/2013 | Son .................. G11C 19/28 345/209 |
| 2014/0118237 A1 | 5/2014 | Wang |

FOREIGN PATENT DOCUMENTS

| | | |
|---|---|---|
| CN | 102682727 A | 9/2012 |
| CN | 102708779 A | 10/2012 |
| CN | 102945651 A | 2/2013 |
| CN | 103065592 A | 4/2013 |
| CN | 103187040 A | 7/2013 |
| KR | 20120011966 A | 2/2012 |

\* cited by examiner

… … …

SHIFT REGISTER UNIT AND DRIVING METHOD THEREOF, GATE DRIVING CIRCUIT AND DISPLAY APPARATUS

TECHNICAL FIELD OF THE DISCLOSURE

The present disclosure relates to the field of display technology, and particularly to a shift register unit and driving method thereof, a gate driving circuit and a display apparatus.

BACKGROUND

The basic principle for a Thin Film Transistor-Liquid Crystal Display (TFT-LCD) to display a frame of picture is to input a square wave of certain width to each pixel row from top to bottom in sequence to perform gating, and then output signals required by each row of pixels from top to bottom in sequence through source driving. Currently, fabricating a display device of such a structure is usually to make a gate driving circuit and a source driving circuit on a glass panel through the Chip On Film (COF) or the Chip On Glass (COG) process. However, when the resolution is high, the outputs of both the gate driving and the source driving are more, and thus the length of the driving circuit would increase, which is disadvantageous to the bonding process of the module driving circuits.

In order to solve the above problems, the existing display device fabrication usually adopts the Gate Drive on Array (GOA) circuit design, which, compared with the conventional COF or COG process, not only saves the cost, but also can realize a beautiful design with the two panel sides being symmetrical while omitting the bonding area of the gate driving circuit and the peripheral wiring space, such as to realize the narrow margin design of the display apparatus, and improve the throughput and yield rate. However, the existing GOA circuit design has some problems as follows. The voltage of the critical nodes for controlling the outputting of the gate row scan signals inside the existing GOA circuit would usually decrease due to the current leakage of the transistors, which causes the output signals of the GOA circuit to have noises. The existing GOA circuit can hardly solve this problem.

SUMMARY

In order to solve the technical problem present in the prior art, embodiments of the present disclosure provide a shift register unit and driving method thereof, a gate driving circuit and a display apparatus, which can reduce the noise of signals output by the shift register unit.

Embodiments of the present disclosure adopt the following technical solutions.

One aspect of the embodiments of the present disclosure provides a shift register unit comprising an input module, a pull-up module, a pull-down control module, a pull-up control module, and a pull-down module.

The input module is connected to a first signal input terminal, a second signal input terminal, a first voltage terminal, a second voltage terminal and a pull-up control node and configured to control the level of the pull-up control node according to a signal input by the first signal input terminal and a signal input by the second signal input terminal.

The pull-up module is connected to the pull-up control node, a clock signal input terminal and a signal output terminal and configured to pull up the signal output by the signal output terminal to a high level according to the control of the pull-up control node and a clock signal input by the clock signal input terminal.

The pull-down control module is connected to a third voltage terminal, a fourth voltage terminal, the pull-up control node and a pull-down control node and configured to control the level of the pull-down node according to the voltage of the pull-up control node.

The pull-up control module is connected to a third signal input terminal, a fourth signal input terminal and the pull-up control node and configured to control the level of the pull-up control node according to a signal input by the third signal input terminal and a signal input by the fourth signal input terminal.

The pull-down module connected to the pull-down control node, the pull-up control node, the fourth voltage terminal and the signal output terminal and configured to pull down the signal output by the signal output terminal to a low level.

Another aspect of embodiments of the present disclosure provides a shift register driving method applied to a shift register unit as described in the above, comprising:

pre-charging the pull-up module by the input module according to the signal input by the first signal input terminal;

raising the level of the pull-up control node by the pull-up control module according to the signal input by the third signal input terminal, and using the high level at the pull-up control node to release the noise at the signal output terminal;

pulling up the signal output by the signal output terminal to the high level by the pull-up module according to the clock signal;

raising the level of the pull-up control node by the pull-up control module according to the signal input by the fourth signal input terminal after the signal output terminal outputs the high level; and raising the level of the pull-down control node under the control of the pull-down control module and the signal input by the second signal input terminal of the input module such that the level of the pull-up control node decreases and the shift register unit completes the noise release.

Another aspect of embodiments of the present disclosure provides a gate driving circuit comprising multiple stages of shift register units as described in the above.

Except the first stage of shift register unit, the signal output terminal of each of other shift register units is connected to the fourth signal input terminal of its adjacent previous one stage of shift register unit.

Except the last stage of shift register unit, the signal output terminal of each of other shift register units is connected to the third signal input terminal of its adjacent next one stage of shift register unit.

Except the first two stages of shift register units, the signal output terminal of each of other shift register units is connected to the second signal input terminal of its previous second stage of shift register unit.

Except the last two stages of shift register units, the signal output terminal of each of other shift register units is connected to the first signal input terminal of its next second stage of shift register unit.

Another aspect of embodiments of the present disclosure provides a display apparatus comprising a gate driving circuit as described in the above.

According to the shift register unit and driving method thereof, the gate driving circuit and the display apparatus provided by embodiments of the present disclosure. The potential of the pull-up control node is continuously raised by the output signals of multiple stages of shift register circuits. The high level of the pull-up control node can release output noise of the shift register unit, such as to improve the quality of the display apparatus product, and ensures the life and the long time stable operation of the GOA circuit.

DETAILED DESCRIPTION

In the following, the technical solutions in embodiments of the present disclosure will be clearly and completely described in connection with the drawings. Obviously, the described embodiments are only part embodiments of the present disclosure, but not all embodiments. Based on the embodiments in the present disclosure, all other embodiments obtained by those skilled in the art without creative work fall in the protection scope of the present disclosure.

The transistors adopted in all the embodiments of the present disclosure can be thin film transistors, field effect transistors or other devices with the same characteristics. Since the source and the drain of the transistor adopted herein are symmetrical, there is no difference between its source and drain. In embodiments of the present disclosure, in order to distinguish the two electrodes other than the gate in the transistor, one electrode among them is referred to as a first electrode and another electrode is referred to as a second electrode. In addition, transistors can be classified into N type transistors and P type transistors according to the characteristics of the transistors. The following embodiments are described by taking N type transistors as an example. When an N type transistor is adopted, the first electrode can be the source of the N type transistor, and the second electrode can be the drain of the N type transistor. It is conceivable that the implementation adopting P type transistors can be easily devised by those skilled in the art without creative work and thus also falls into the protection scope of the embodiments of the present disclosure.

Figure 1:
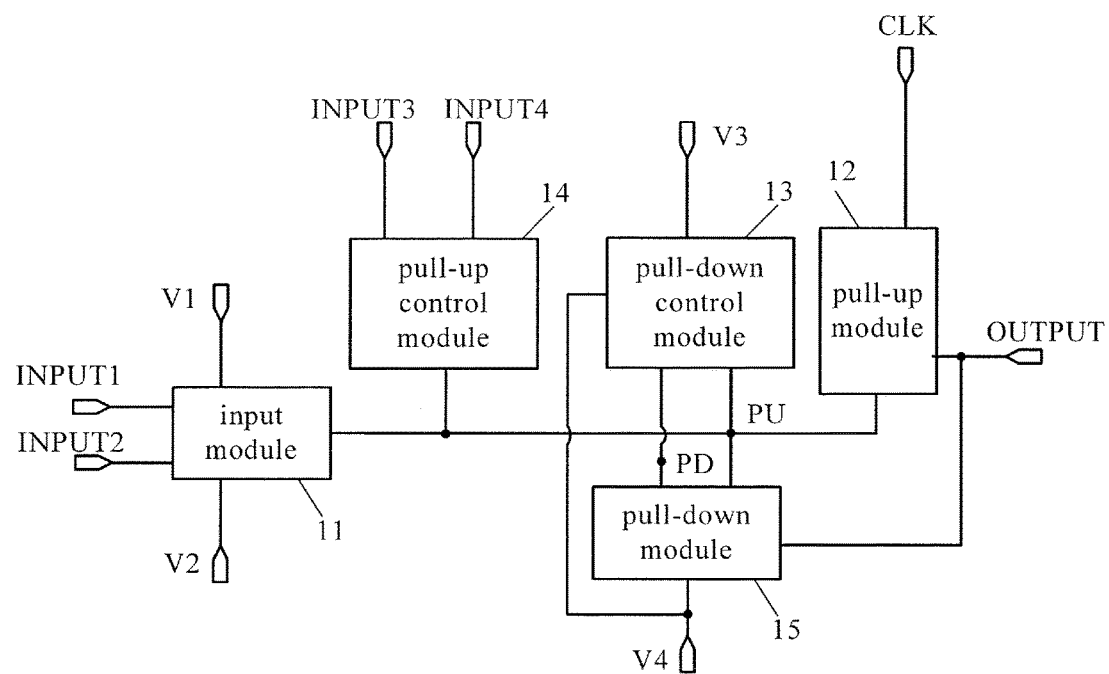
FIG. 1 is a schematic diagram of structure of a shift register unit according to an embodiment of the present disclosure.

As shown in FIG. 1, a shift register unit according to an embodiment of the present disclosure comprises an input module 11, a pull-up module 12, a pull-down control module 13, a pull-up control module 14 and a pull-down module 15.

The input module 11 is connected to a first signal input terminal INPUT1, a second signal input terminal INPUT2, a first voltage terminal V1, a second voltage terminal V2 and a pull-up control node PU, and configured to control the level of the pull-up control node PU according to a signal input by the first signal input terminal INPUT1 and a signal input by the second signal input terminal INPUT2. The pull-up control node PU is the connection point of the input module 11 and the pull-up module 12.

The pull-up module 12 is connected to the pull-up control node PU, a clock signal input terminal CLK and a signal output terminal OUTPUT, and configured to pull up the signal output by the signal output terminal OUTPUT to a high level according to the control of the pull-up control node PU and a clock signal input by the clock signal input terminal CLK.

The pull-down control module 13 is connected to a third voltage terminal V3, a fourth voltage terminal V4, the pull-up control node PU and a pull-down control node PD, and configured to control the level of the pull-down node PD according to the voltage of the pull-up control node PU. The pull-down control node PD is the connection point of the pull-down control module 13 and the pull-down module 15.

The pull-up control module 14 is connected to a third signal input terminal INPUT3, a fourth signal input terminal INPUT4 and the pull-up control node PU, and configured to control the level of the pull-up control node PU according to a signal input by the third signal input terminal INPUT 3 and a signal input by the fourth signal input terminal INPUT4.

The pull-down module 15 is connected to the pull-down control node PD, the pull-up control node PU, the fourth voltage terminal V4 and the signal output terminal OUTPUT, and configured to pull down the signal output by the signal output terminal OUTPUT to a low level.

The shift register unit according to the embodiment of the present disclosure continuously raises the potential of the pull-up control node by the output signals of multiple stages of shift register circuits. The high level of the pull-up control node can be used to release output noise of the shift register unit, such as to improve the quality of the display apparatus product, and ensures the life and the long time stable operation of the GOA circuit.

Specifically, the first voltage terminal V1 can be input with the high level VDD, the second voltage terminal V2 can be input with the low level VSS, the third voltage terminal V3 can be input with the high level VGH, and the fourth voltage terminal V4 can be a grounded terminal or at the low level VGL.

Figure 2:
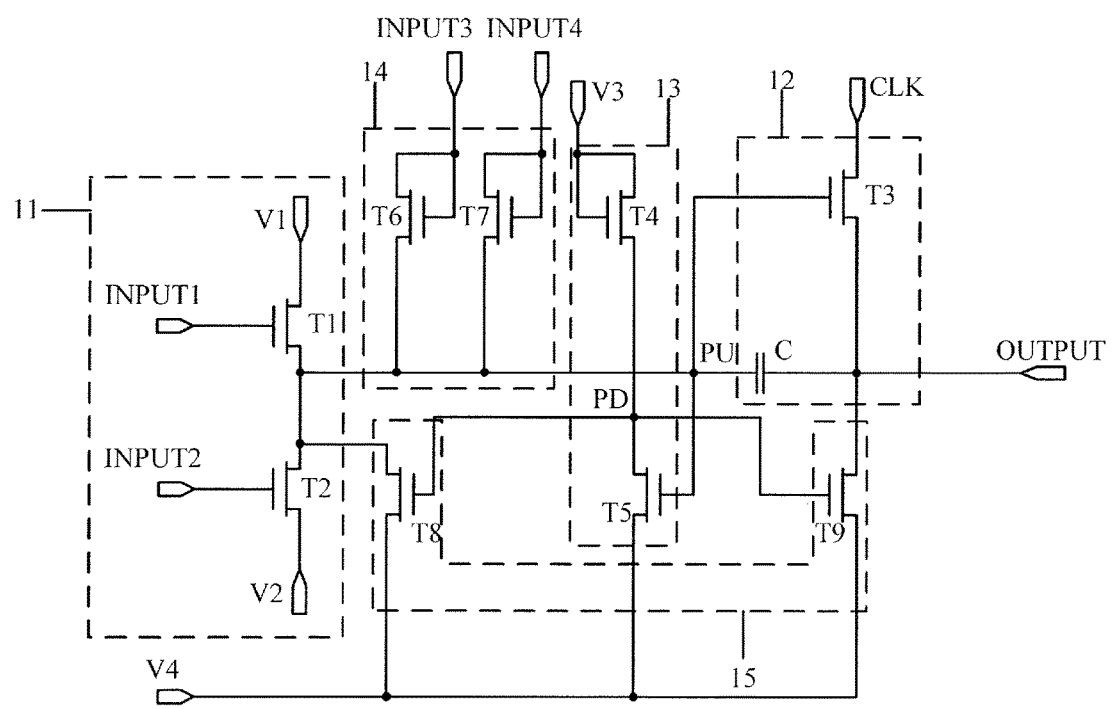
FIG. 2 is a schematic diagram for the circuit connection structure of a shift register unit according to an embodiment of the present disclosure.

Further, as shown in FIG. 2, in the shift register of an embodiment of the present disclosure, the input module 11 can comprise: a first transistor T1 whose first electrode is connected to the pull-up control node PU, whose gate is connected to the first signal input terminal INPUT1, and whose second electrode is connected to the first voltage terminal V1; and a second transistor T2 whose first electrode is connected to the pull-up control node PU, whose gate is connected to the second signal control terminal INPUT2, and whose second electrode is connected to the second voltage terminal V2.

In embodiments of the present disclosure, the pull-up control node PU refers to a circuit node for controlling the pull-up module to be at a turn-on state or a turn-off state. The function of the input module 11 is specifically to determine the level of the pull-up control node PU to be high or low according to different high or low levels of the first signal input terminal INPUT1 and the second signal input terminal INPUT2 so as to determine the shift register unit to be at an output or reset state currently.

When signals output by previous and next stages of shift register units are used respectively as the input signals of the first signal input terminal INPUT1 or the second signal input control terminal INPUT2 of the present stage of shift register unit, the input module 11 of such a structure can perform bidirectional scan of the gate driving circuit. Specifically, the first signal input terminal INPUT1 can be input with a signal Output(N−2) output by the previous second stage of shift register unit, and the second signal input terminal INPUT1 can be input with a signal Output(N+2) output by the next second stage of shift register unit.

When the first voltage terminal V1 is input with the high level VDD and the second voltage terminal V2 is input with the low level VSS, the high level output by the previous second stage of shift register unit can pre-charge the pull-up module 12 through the input module 11, and the high level output by the next second stage of shift register unit can resets the pull-up module 12 through the input module 11.

When the first voltage terminal V1 is input with the low level VSS and the second voltage terminal V2 is input with the high level VDD, the high level output by the next second stage of shift register unit can pre-charge the pull-up module 12 through the input module 11, and the high level output by the previous second stage of shift register unit can reset the pull-up module 12 through the input module 11.

Further, as shown in FIG. 2, the pull-up module 12 can comprise: a third transistor T3 whose first electrode is connected to the signal output terminal OUTPUT, whose gate is connected to the pull-up control node PU, and whose second electrode is connected to the clock signal input terminal CLK; and a capacitor C connected between the gate and the first electrode of the third transistor T3 in parallel.

In embodiments of the present disclosure, the function of the pull-up module 12 is to enable the signal output terminal OUTPUT to output a high level signal for gate driving in a clock period where the clock signal is at the high level after the pre-charging.

Further as shown in FIG. 2, the pull-down control module 13 can comprise: a fourth transistor T4 whose first electrode is connected to the pull-down control node PD and whose gate and second electrode are both connected to the third voltage terminal V3; and a fifth transistor T5 whose first electrode is connected to the pull-down control node PD, whose gate is connected to the pull-up control node PU, and whose second electrode is connected to the fourth voltage terminal V4.

In embodiments of the present disclosure, the function of the pull-down control module 13 is to control the level of the pull-down control node PD under the control of the voltage of the pull-up control node PU, wherein the pull-down control node PD refers to a circuit node for controlling the pull-down module to be at the turn-on state or the turn-off state.

Further, as shown in FIG. 2, the pull-up control module 14 can comprise: a sixth transistor T6 whose first electrode is connected to the pull-up control node PU and whose gate and second electrode are both connected to the third signal input terminal INPUT3; and a seventh transistor T7 whose first electrode is connected to the pull-up control node PU and whose gate and second electrode are both connected to the fourth signal input terminal INPUT4.

Herein, the third signal input terminal INPUT3 is configured to input a signal Output(N−1) output by the previous one stage of shift register unit, the fourth signal input terminal INPUT4 is configured to input a signal Output(N+1) output by the next one stage of shift register unit. The pull-up control module 14 raises the level of the pull-up control node PU according to the signal Output(N−1) output by the previous one stage of shift register unit and the signal Output(N+1) output by the next one stage of shift register unit respectively.

Further, as shown in FIG. 2, the pull-down module 15 can comprise: an eighth transistor T8 whose first electrode is connected to the fourth voltage terminal V4, whose gate is connected to the pull-down control node PD, and whose second electrode is connected to the pull-up control node PU; and a ninth transistor T9 whose first electrode is connected to the fourth voltage terminal V4, whose gate is connected to the pull-down control node PD, and whose second electrode is connected to the signal output terminal OUTPUT.

In embodiments of the present disclosure, the function of the pull-down module 15 is specifically to pull down the potential of the pull-up control node PU and the signal output terminal OUTPUT respectively when the pull-down control node PD has a high potential and the clock signal is at the low level under the control of the output signal of the pull-down control module 13. The shift register unit of such a structure can ensure the release of the circuit noise after the gate driving signal is output so as to improve the quality of the scan driving.

The shift register unit as shown in FIG. 2 comprises 9 N type transistors and 1 capacitor (9T1C). As compared with the prior art, in the design of such a circuit structure, the number of elements is relatively small, so that the difficulty of the circuit design and fabrication is eased, the size of the circuit area and the wiring space is effectively controlled, and the narrow margin design of the display apparatus is realized.

According to an embodiment of the present disclosure, there is also provided a shift register driving method which can be applied to a shift register unit as described in the above. The method comprises the following operation procedures.

At step S101, the input module pre-charges the pull-up module according to the signal input by the first signal input terminal.

At step S102, the pull-up control module raises the level of the pull-up control node according to the signal input by the third signal input terminal, and uses the high level at the pull-up control node to release the noise at the signal output terminal, wherein the pull-up control module is configured to control the level of the pull-up control node according to the signal input by the third signal input terminal and the signal input by the fourth signal input terminal.

At step S103, the pull-up module pulls up the signal output by the signal output terminal to the high level according to the clock signal.

At step S104, after the signal output terminal outputs the high level, the pull-up control module raises the level of the pull-up control node according to the signal input by the fourth signal input terminal.

At step S105, under the control of the pull-down control module and the signal input by the second signal input terminal of the input module, the level of the pull-up control node is pulled down such that the level of the pull-down control node increases and the signal output terminal is connected with the low level.

The shift register driving method according to the embodiment of the present disclosure continuously raises the potential of the pull-up control node by the output signals of multiple stages of shift register circuits. The high level of the pull-up control node can be used to release output noise of the shift register unit, so as to improve the quality of the display apparatus product, and ensures the life and the long time stable operation of the GOA circuit.

With the shift register units of such a structure, bidirectional scan of the gate driving circuit can be performed by changing the control signal level to be high or low. For example, in the shift register unit as shown in FIG. 2, the first signal input terminal INPUT 1 can be input with the signal Output(N−2) output by the previous second stage of shift register unit, and the second signal input terminal INPUT2 can be input with the signal Output(N+2) output by the next second stage of shift register unit. The first signal input terminal INPUT 1 can also be input with a signal Output (N+2) output by the next second stage of shift register unit, and the second signal input terminal INPUT2 can also be input with a signal Output(N−2) output by the previous second stage of shift register unit. The third signal input terminal INPUT3 can be input with a signal output Output (N−1) by the previous one stage of shift register unit, and the fourth signal input terminal INPUT4 can be input with a signal Output(N+1) output by the next one stage of shift register unit.

When the first voltage terminal V1 is input with the high level VDD and the second voltage terminal V2 is input with the low level VSS, the high level output by the previous second stage of shift register unit can pre-charge the pull-up module 12 through the input module 11, and the high level output by the next second stage of shift register unit can reset the pull-up module 12 through the input module 11.

When the first voltage terminal V1 is input with the low level VSS and the second voltage terminal V2 is input with the high level VDD, the high level output by the next second stage of shift register unit can pre-charges the pull-up module 12 through the input module 11, and the high level output by the previous second stage of shift register unit can reset the pull-up module 12 through the input module 11.

Figure 3:
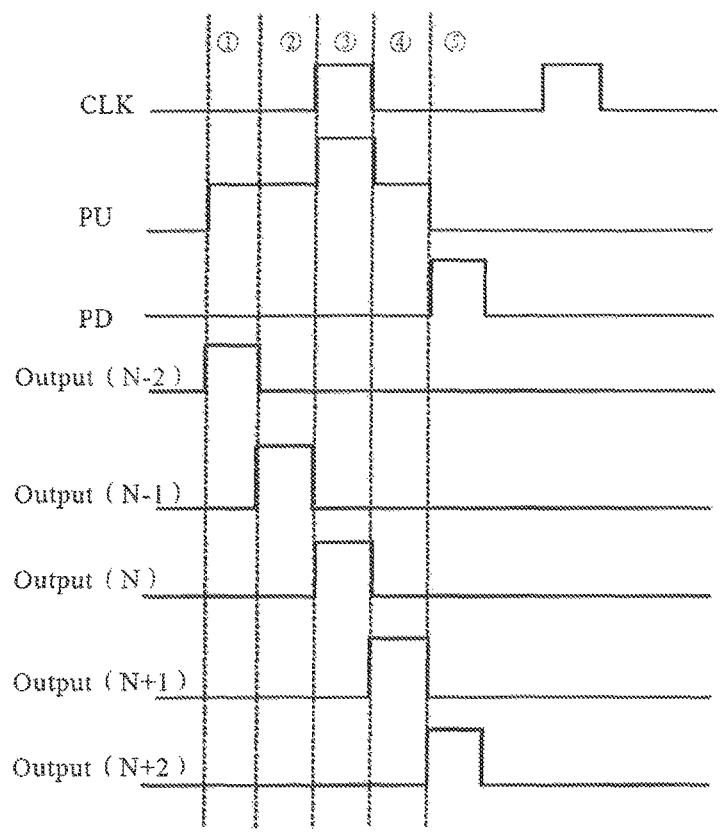
FIG. 3 is a signal timing waveform diagram under operation of a shift register unit according to an embodiment of the present disclosure.

Specifically, the driving method and operation states of the shift register unit according to an embodiment of the present disclosure as shown in FIG. 2 will be described in detail in connection with the signal time sequence state diagram shown in FIG. 3. At this time, the first voltage terminal V1 is input with the high level VDD, the second voltage terminal V2 is input with the low level VSS, the third voltage terminal V3 is input with the high level VGH, the fourth voltage terminal V4 is at the low level VGL, the first signal input terminal INPUT1 is input with the signal OUTPUT(N−2) output by the previous second stage of shift register unit, and the second signal input terminal INPUT2 is input with the reset signal Output(N+2) output by the next second stage of shift register unit.

Stage ①: the signal OUTPUT(N−2) output by the previous second stage of shift register unit is at a high level, the transistor T1 is turned on, VDD is the high level, the voltage of the pull-up control node PU is raised, now the transistor T3 is turned on, at the same time, the pull-up control node PU controls the transistor T5 to be turned on, the pull-down control node PD is connected with the low potential VGL, now the clock signal CLK is the low level, and the signal output terminal outputs the low level.

Stage ②: during this stage, the signal Output(N−1) output by the previous one stage of shift register unit is the high level, the transistor T6 is turned on, the voltage of the pull-up control node PU is raised by the voltage of Output (N−1), now the present stage of shift register unit still has no output. The high level of the node PU can be used to release the noise of the signal output terminal Output.

Stage ③: now the clock signal CLK is at the high level, the potential of the pull-up control node PU is further raised due to the bootstrap effect of the capacitor C, the transistors T3 and T5 are turned on, and the signal output terminal Output of the present stage of shift register unit outputs the high level.

Stage ④: during this stage, the signal Output(N+1) output by the next one stage of shift register unit is the high level, the transistor T7 is turned on, the voltage of the pull-up control node PU is raised by the voltage of Output (N+1) such that the pull-up control node PU still remains the high level, the transistor T3 is turned on, now the clock signal CLK is at the low level, the signal output terminal Output of the present stage outputs the low level, but the voltage of the PU node at this time will be pulled down due to the current leakage effect of the TFTs, and the transistor T4 is turned on by using the high level of the output Output(N+1) of the next stage to raise the PU voltage.

Stage ⑤: now, the output signal Output(N+2) of the next second stage is taken as the reset signal, the transistor T2 is turned on, the level of the pull-up control node PU decreases, the level of the pull-down control node PD increases such as to accomplish the noise release of the present stage of shift register unit. Specifically, because the voltage VGH of the third voltage terminal V3 remains the high level, the potential at PD increases and the transistors T8 and T9 are turned on such that the pull-up control node PU and the signal output terminal are connected to the fourth voltage terminal V4 respectively. Since the voltage at V4 is the low level VGL, the noise release of the circuit is ensured after the present stage of shift register unit completes the output.

Figure 4:
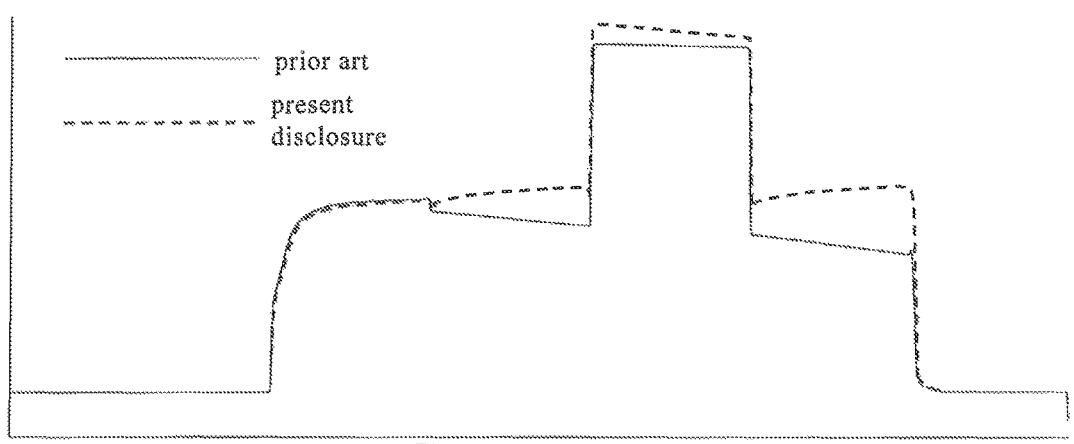
FIG. 4 is a comparison diagram for potential raising effect of a shift register unit according to an embodiment of the present disclosure.

Specifically, the potential at the pull-up control node PU can be effectively raised by using such a shift register driving method according to an embodiment of the present disclosure. As shown in FIG. 4, compared with the potential scenario of the pull-up control node in the prior art, the potential at node PU is all obviously raised at stages ②, ③ and ④.

As such, the shift from Output(N−1) to the present stage Output and then to Output(N+1) is realized, that is, the scan output of the gate row driving from top to bottom is realized. It is noted that, the pre-charging and reset manners can be exchanged by changing the high or low potential of the signal Output(N−2), Output(N+2), VDD and VSS, to realize the bidirectional scan of the gate driving circuit from top to bottom or from bottom to top respectively.

The shift register unit in an embodiment of the present disclosure comprises 9 N type transistors and 1 capacitor (9T1C). As compared with the prior art, in the design of such a circuit structure, the number of devices is relatively small, so that the difficulty of the circuit design and fabrication is eased, the size of the circuit area and the wiring area is effectively controlled, and the narrow margin design of the display apparatus is realized.

Figure 5:
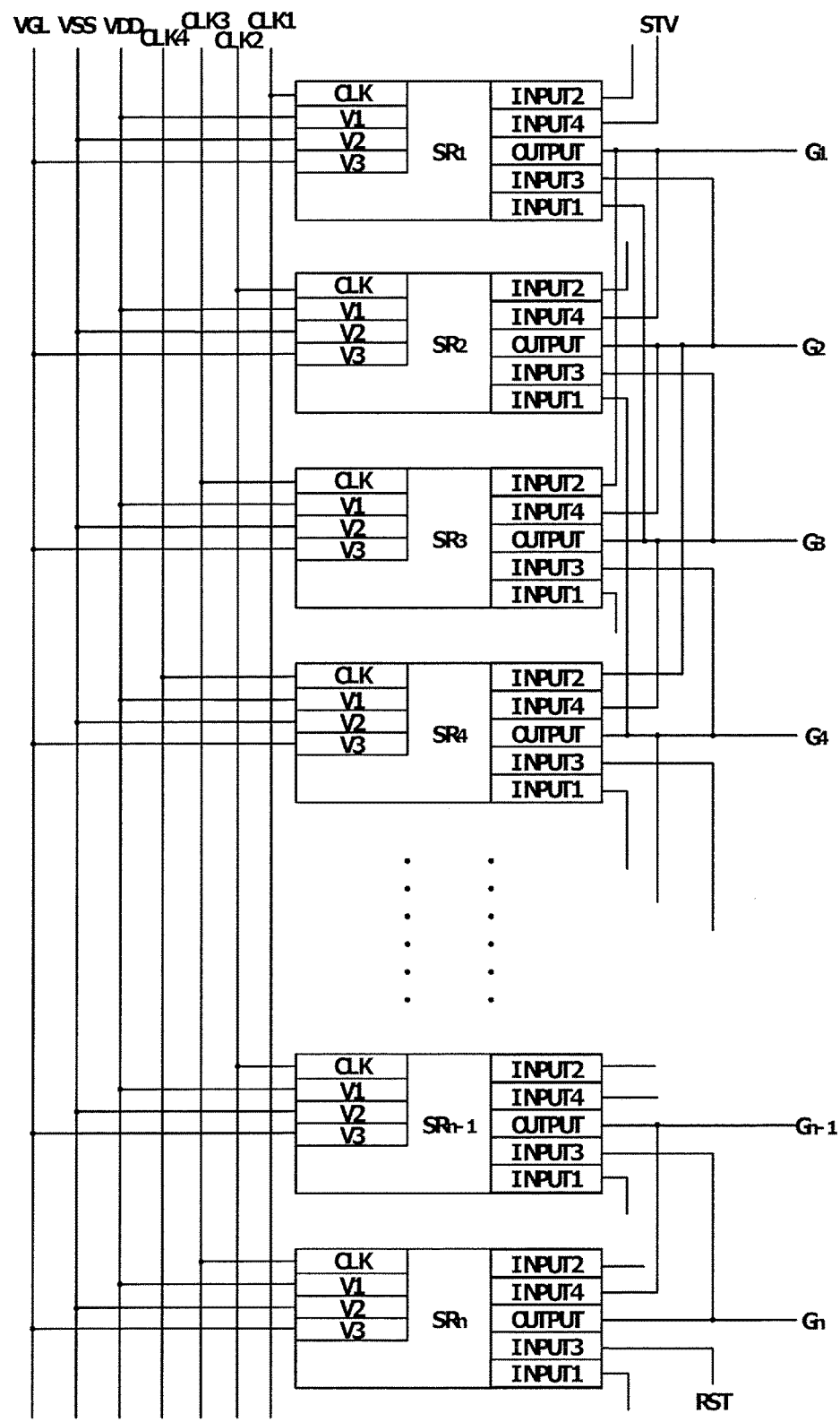
FIG. 5 is a schematic diagram of structure of a gate driving circuit according to an embodiment of the present disclosure.

As shown in FIG. 5, a gate driving circuit according to an embodiment of the present disclosure comprises multiple stages of shift register units as described in the above, wherein the output terminal OUTPUT of each stage of shift register unit SR outputs the row scan signal G of the present stage, and each shift register unit has one clock signal input.

Except the first stage of shift register unit SR0, the signal output terminal OUTPUT of each of other shift register units is connected to the fourth signal input terminal INPUT4 of its adjacent previous one stage of shift register unit.

Except the last stage of shift register unit SRn, the signal output terminal OUTPUT of each of other shift register units is connected to the third signal input terminal INPUT3 of its adjacent next one stage of shift register unit.

Except the first two stages of shift register units SR0 and SRn, the signal output terminal of each of other shift register units is connected to the second signal input terminal INPUT2 of its previous second stage of shift register unit.

Except the last two stages of shift register units SRn−1 and SRn, the signal output terminal of each of other shift register units is connected to the first signal input terminal INPUT1 of its next second stage of shift register unit.

In an embodiment of the present disclosure, the first signal input terminal INPUT1 of the first stage of shift register unit SR0 can be input with a frame start signal STV; the second signal input terminal INPUT2 of the last stage of shift register unit SRn can be input with a reset signal RST.

The gate driving circuit according to the embodiment of the present disclosure comprises shift register units, and continuously raises the potential of the pull-up control node by the output signals of multiple stages of shift register circuits. The high level of the pull-up control node can be used to release output noise of the shift register unit, such as to improve the quality of the display apparatus product, and ensures the life and the long time stable operation of the GOA circuit.

It is noted that, in order to further increase the scan frequency of the gate driving circuit, multiple groups of clock signals can be used to be input to different rows of shift register units. For example, in the gate driving circuit as shown in FIG. 5, the external clock signal input terminals can comprise CLK1, CLK2, CLK3 and CLK4 respectively. The clock signal input terminal connected to the transistor T3 of the first row of shift register units is CLK1, the clock signal input terminal connected to the transistor T3 of the second row of shift register units is CLK2, and so on. Herein, the clock signal input by every clock signal input terminal has the same period, and the phases of the clock signals are all different from one another. It is possible to have higher scan frequency by using such a clock signal to control the gate driving circuit, such as to improve the display quality of the display apparatus obviously.

Figure 6:
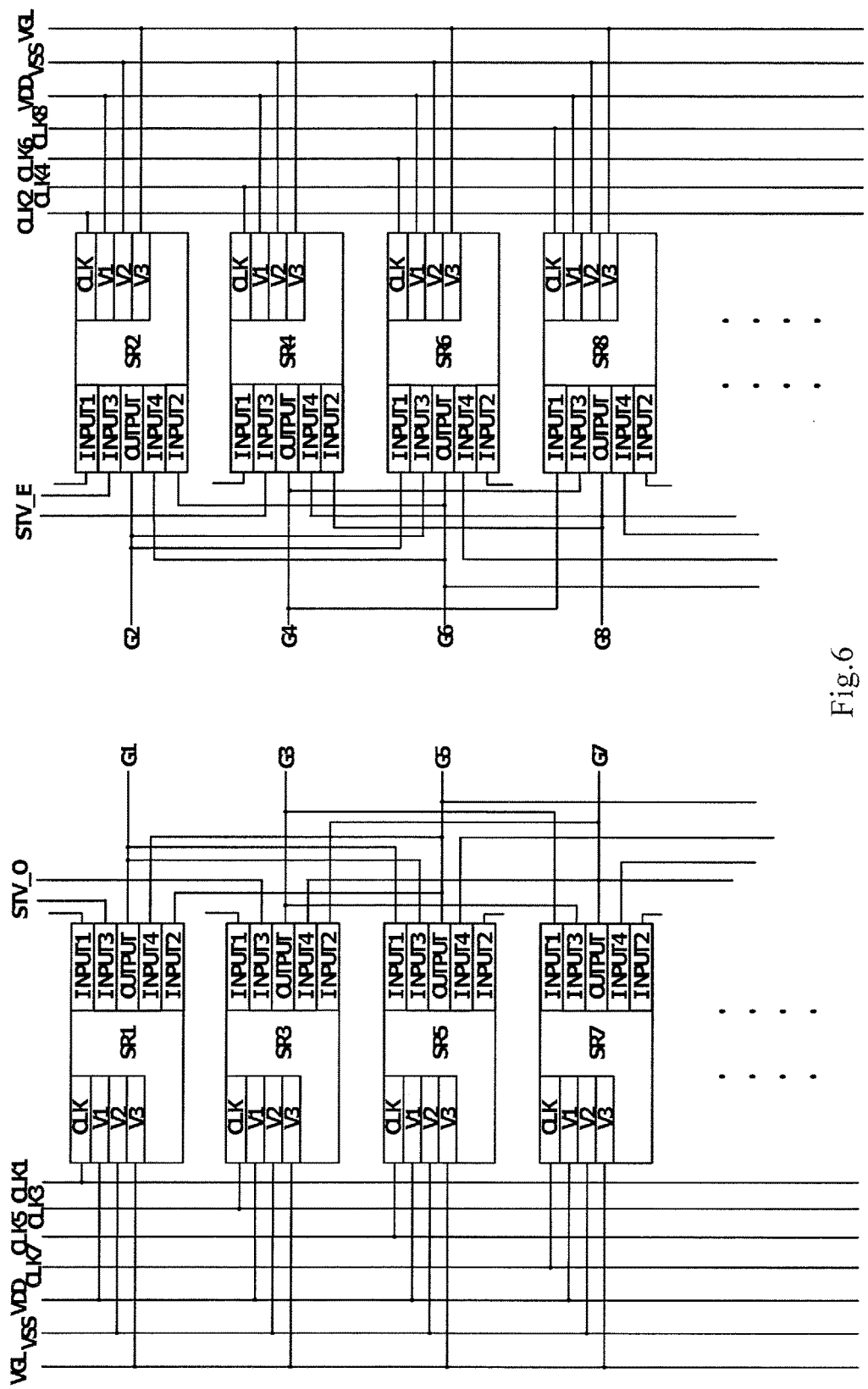
FIG. 6 is a schematic diagram of structure of another gate driving circuit according to an embodiment of the present disclosure.

Further, as shown in FIG. 6, in the gate driving circuit according to an embodiment of the present disclosure, the shift register units for odd rows are located at one end of a display panel, and the shift register units for even rows are located at the other end of the display panel. Accordingly, the external clock signal input terminals can comprise 8 clock signal input terminals CLK1-CLK8. CLK1, CLK3, CLK5 and CLK7 are taken as the external clock signal input terminals connected to the shift register units for the odd rows, and CLK2, CLK4, CLK6 and CLK8 are taken as the external clock signal input terminals connected to the shift register units for the even rows. Corresponding to the clock signals, the frame start signal STV also comprises two groups of frame start signals with different phases. The different frame start signal are input respectively to the first signal input terminals INPUT1 of corresponding shift register units. The frame start signal STV_O is connected to the signal input terminals INPUT1 of the first two stages of shift register units for the odd rows, and the frame start signal STV_E is connected to the signal input terminals INPUT1 of the first two stages of shift register units for the even rows.

In the embodiment of the present disclosure, all the external signals adopt a duty ratio of one quarter. The signal of such a duty ratio can ensure the realization of the above shift register functions.

Herein, the output terminal OUTPUT of each stage of shift register unit SR at both ends of the display panel outputs the row scan signal G of the present stage, and each shift register unit has one clock signal input.

Among the shift register units for the odd rows located at one end of the display panel and the shift register units for the even rows located at the other end of the display panel, except the signal input terminals of the first stage of shift register unit and the second or shift register unit, the signal input terminal INPUT of each shift register unit is connected to the first signal output terminal OUTPUT of its adjacent previous second stage of shift register unit.

Among the shift register units for the odd rows located at one end of the display panel and the shift register units for the even rows located at the other end of the display panel, except the last two stages of shift register units SRn−1 and SRn, the second signal input terminal INPUTs of each shift register unit is connected to the signal output terminal OUTPUT of its adjacent next second stage of shift register unit.

Figure 7:
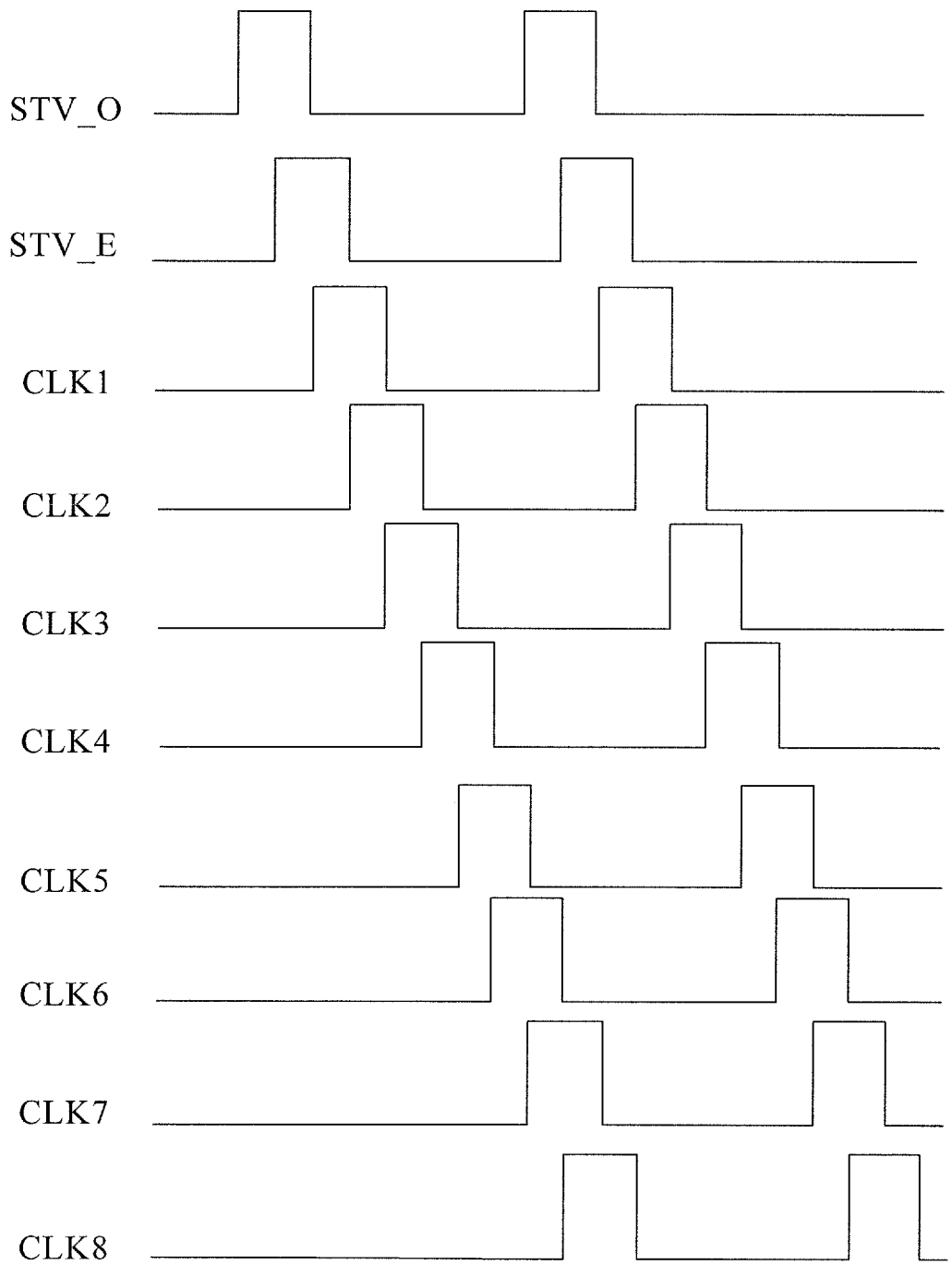
FIG. 7 is a signal timing waveform diagram of a gate driving circuit according to an embodiment of the present disclosure when a scan is performed from top to bottom.

Specifically, for the gate driving circuit as shown in FIG. 6, when the gate driving circuit adopts a scan manner from top to bottom, the timing waveforms of its control signal and clock signal are as shown in FIG. 7. Herein, corresponding to the clock signals, the frame start signals STV also comprise multiple groups of frame start signals with different phases, and different frame start signals are input into the first signal input terminals INPUT1 of corresponding shift register units respectively, as shown in FIG. 7, comprising STV_O and STV_E. Each frame start signal provides a square wave in the stage when the corresponding shift register starts to output. When such a timing control signal is used to perform control, the row driving signals of the gate driving circuit would be output from G0 to Gn and from top to bottom in turn.

Figure 8:
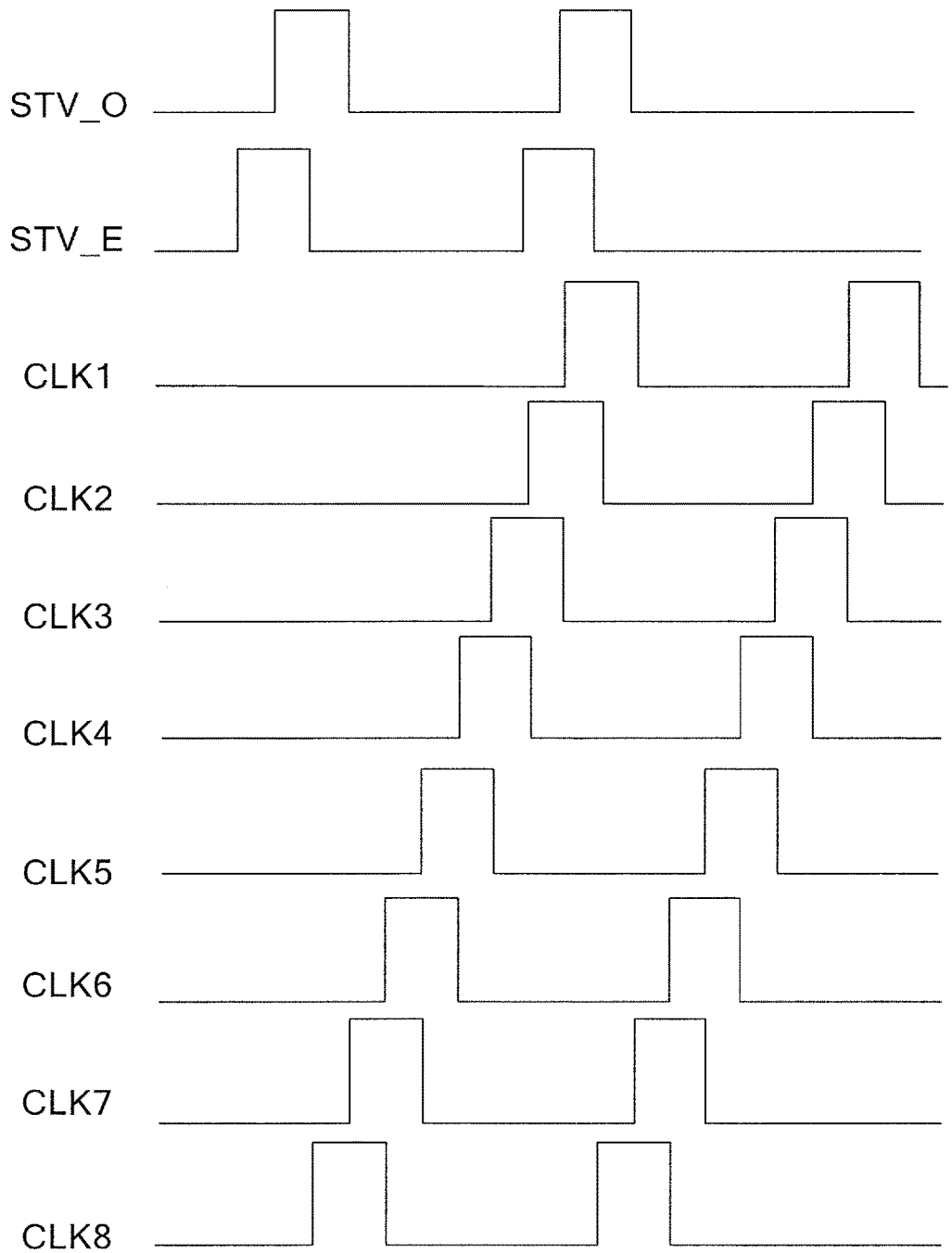
FIG. 8 is a signal timing waveform diagram of a gate driving circuit according to an embodiment of the present disclosure when a scan is performed from bottom to top.

When the gate driving circuit adopts a scan manner from bottom to top, the timing waveforms of its control signal and clock signal are as shown in FIG. 8. Different from the timing waveform shown in FIG. 7, the external clock signal input terminals perform signal input in the order from CLK8 to CLK1. When such a timing control signal is used to perform control, the row driving signals of the gate driving circuit would be output from Gn to G0 and from bottom to top in turn.

With the gate driving circuit as shown in FIG. 6, the design in which line widths of the two ends of the display apparatus are equal is further realized, while the output noise of the shift register unit is released by raising the pull-up control node to improve the quality of the display apparatus product. Therefore, the beauty of the appearance design of the display apparatus is ensured while increasing the scan frequency, thereby improving users' use experience.

According to an embodiment of the present disclosure, there is also provided a display apparatus comprising a gate driving circuit as described in the above.

Since the structure of the gate driving circuit has been described in the above embodiments in detail, it will not be described again here.

The display apparatus according to the embodiment of the present disclosure comprises a gate driving circuit which further comprises shift register units. With the shift register unit with such a structure, the potential of the pull-up control node is continuously raised by the output signals of multiple stages of shift register circuits. The high level of the pull-up control node can release output noise of the shift register unit, such as to improve the quality of the display apparatus product, and ensures the life and the long time stable operation of the GOA circuit.

The above descriptions are only specific implementations of the present disclosure, but the protection scope of the present disclosure is not limited to that. Any changes or alternations which can be easily conceived by those skilled in the art within the technical scope disclosed by the present disclosure should fall in the protection scope of the present disclosure. Therefore, the protection scope of the present disclosure should be defined by the protection scope of the claims.

What is claimed is:

1. A shift register unit comprising:
   an input module connected to a first signal input terminal, a second signal input terminal, a first voltage terminal, a second voltage terminal and a pull-up control node, and configured to control the level of the pull-up control node according to a signal input by the first signal input terminal and a signal input by the second signal input terminal;
   a pull-up module connected to the pull-up control node, a clock signal input terminal and a signal output terminal, and configured to pull up the signal output by the signal output terminal to a high level according to the control of the pull-up control node and a clock signal input by the clock signal input terminal;
   a pull-down control module connected to a third voltage terminal, a fourth voltage terminal, the pull-up control node and a pull-down control node, and configured to control the level of the pull-down node according to the voltage of the pull-up control node;
   a pull-up control module connected to a third signal input terminal, a fourth signal input terminal and the pull-up control node, and configured to control the level of the pull-up control node according to a signal input by the third signal input terminal and a signal input by the fourth signal input terminal; and
   a pull-down module connected to the pull-down control node, the pull-up control node, the fourth voltage terminal and the signal output terminal, and configured to pull down the signal output by the signal output terminal to a low level,
   wherein the pull-up control node is the connection point of the input module and the pull-up module, and the pull-down control node is the connection point of the pull-down control module and the pull-down module; and
   wherein the third signal input terminal is input with a signal output by the previous one stage of shift register unit, and the fourth signal input terminal is input with s signal output by the next one stage of shift register unit.

2. A gate driving circuit comprising multiple stages of shift register units according to claim 1, wherein
   except the first stage of shift register unit, the signal output terminal of each of other shift register units is connected to the fourth signal input terminal of its adjacent previous one stage of shift register unit;
   except the last stage of shift register unit, the signal output terminal of each of other shift register units is connected to the third signal input terminal of its adjacent next one stage of shift register unit;
   except the first two stages of shift register units, the signal output terminal of each of other shift register units is connected to the second signal input terminal of its previous second stage of shift register unit;
   except the last two stages of shift register units, the signal output terminal of each of other shift register units is connected to the first signal input terminal of its next second stage of shift register unit.

3. A display apparatus comprising the gate driving circuit according to claim 2.

4. The display apparatus according to claim 3, wherein the first signal input terminal of the first stage of shift register unit is input with a frame start signal; the second signal input terminal of the last stage of shift register unit is input with a reset signal.

5. The display apparatus according to claim 3, wherein multiple groups of clock signals are used to be input to different rows of shift register units.

6. The gate driving circuit according to claim 2, wherein the first signal input terminal of the first stage of shift register unit is input with a frame start signal; the second signal input terminal of the last stage of shift register unit is input with a reset signal.

7. The gate driving circuit according to claim 2, wherein multiple groups of clock signals are used to be input to different rows of shift register units.

8. The gate driving circuit according to claim 2, wherein the shift register units for odd rows are located at one end of a display panel, and the shift register units for even rows are located at the other end of the display panel.

9. The gate driving circuit according to claim 2, wherein the input module comprises:
   a first transistor whose first electrode is connected to the pull-up control node, whose gate is connected to the first signal input terminal, and whose second electrode is connected to the first voltage terminal; and
   a second transistor whose first electrode is connected to the pull-up control node, whose gate is connected to the second signal control terminal, and whose second electrode is connected to the second voltage terminal.

10. The gate driving circuit according to claim 2, wherein the pull-up module comprises:
    a third transistor whose first electrode is connected to the signal output terminal, whose gate is connected to the pull-up control node, and whose second electrode is connected to the clock signal input terminal; and
    a capacitor connected between the gate of the third transistor and the first electrode of the third transistor in parallel.

11. The gate driving circuit according to claim 2, wherein the pull-down control module comprises:
    a fourth transistor whose first electrode is connected to the pull-down control node and whose gate and second electrode are both connected to the third voltage terminal; and
    a fifth transistor whose first electrode is connected to the pull-down control node, whose gate is connected to the pull-up control node, and whose second electrode is connected to the fourth voltage terminal.

12. The gate driving circuit according to claim 2, wherein the pull-up control module comprises:
    a sixth transistor whose first electrode is connected to the pull-up control node and whose gate and second electrode are both connected to the third signal input terminal; and
    a seventh transistor whose first electrode is connected to the pull-up control node and whose gate and second electrode are both connected to the fourth signal input terminal.

13. The gate driving circuit according to claim 2, wherein the pull-down module comprises:

an eighth transistor whose first electrode is connected to the fourth voltage terminal, whose gate is connected to the pull-down control node, and whose second electrode is connected to the pull-up control node; and a ninth transistor whose first electrode is connected to the fourth voltage terminal, whose gate is connected to the pull-down control node, and whose second electrode is connected to the signal output terminal.

14. The shift register unit according to claim 1, wherein the input module comprises:

a first transistor whose first electrode is connected to the pull-up control node, whose gate is connected to the first signal input terminal, and whose second electrode is connected to the first voltage terminal; and a second transistor whose first electrode is connected to the pull-up control node, whose gate is connected to the second signal control terminal, and whose second electrode is connected to the second voltage terminal.

15. The shift register unit according to claim 1, wherein the pull-up module comprises:

a third transistor whose first electrode is connected to the signal output terminal, whose gate is connected to the pull-up control node, and whose second electrode is connected to the clock signal input terminal; and a capacitor connected between the gate of the third transistor and the first electrode of the third transistor in parallel.

16. The shift register unit according to claim 1, wherein the pull-down control module comprises:

a fourth transistor whose first electrode is connected to the pull-down control node and whose gate and second electrode are both connected to the third voltage terminal; and a fifth transistor whose first electrode is connected to the pull-down control node, whose gate is connected to the pull-up control node, and whose second electrode is connected to the fourth voltage terminal.

17. The shift register unit according to claim 1, wherein the pull-up control module comprises:

a sixth transistor whose first electrode is connected to the pull-up control node and whose gate and second electrode are both connected to the third signal input terminal; and a seventh transistor whose first electrode is connected to the pull-up control node and whose gate and second electrode are both connected to the fourth signal input terminal.

18. The shift register unit according to claim 1, wherein the pull-down module comprises:

an eighth transistor whose first electrode is connected to the fourth voltage terminal, whose gate is connected to the pull-down control node, and whose second electrode is connected to the pull-up control node; and a ninth transistor whose first electrode is connected to the fourth voltage terminal, whose gate is connected to the pull-down control node, and whose second electrode is connected to the signal output terminal.

19. A shift register driving method applied to a shift register unit according to claim 1, wherein the method comprises the following steps of:

pre-charging the pull-up module by the input module according to the signal input by the first signal input terminal;

raising the level of the pull-up control node by the pull-up control module according to the signal input by the third signal input terminal, and using the high level at the pull-up control node to release the noise at the signal output terminal, wherein the pull-up control module is configured to control the level of the pull-up control node according to the signal input by the third signal input terminal and the signal input by the fourth signal input terminal;

pulling up the signal output by the signal output terminal to the high level by the pull-up module according to the clock signal;

raising the level of the pull-up control node by the pull-up control module according to the signal input by the fourth signal input terminal after the signal output terminal outputs the high level; and pulling down the level of the pull-up control node under the control of the pull-down control module and the signal input by the second signal input terminal of the input module such that the level of the pull-down control node increases and the signal output terminal is connected with the low level.

20. The method according to claim 19, wherein the first signal input terminal is input with a signal output by the previous second stage of shift register unit, the second signal input terminal is input with a signal output by the next second stage of shift register unit;

when the first voltage terminal is input with the high level and the second voltage terminal is input with the low level, the high level output by the previous second stage of shift register unit pre-charges the pull-up module of the present stage of shift register unit through the input module, the high level output by the next second stage of shift register unit resets the pull-up module of the present stage of shift register unit through the input module;

when the first voltage terminal is input with the low level and the second voltage terminal is input with the high level, the high level output by the next second stage of shift register unit pre-charges the pull-up module of the present stage of shift register unit through the input module, the high level output by the previous second stage of shift register unit resets the pull-up module of the present stage of shift register unit through the input module.

* * * * *